United States Patent
Ishimatsu et al.

(10) Patent No.: US 8,273,207 B2
(45) Date of Patent: Sep. 25, 2012

(54) METHOD FOR CONNECTING ELECTRONIC PART AND JOINED STRUCTURE

(75) Inventors: Tomoyuki Ishimatsu, Tochigi (JP); Daisuke Sato, Tochigi (JP); Hiroki Ozeki, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 202 days.

(21) Appl. No.: 12/631,210

(22) Filed: Dec. 4, 2009

(65) Prior Publication Data
US 2010/0080995 A1   Apr. 1, 2010

Related U.S. Application Data

(63) Continuation of application No. PCT/JP2008/059388, filed on May 21, 2008.

(30) Foreign Application Priority Data

Jun. 6, 2007   (JP) .................................. 2007-150180

(51) Int. Cl.
  *B29C 65/00*   (2006.01)
  *B31B 1/60*    (2006.01)
  *B32B 37/00*   (2006.01)
  *B32B 7/12*    (2006.01)
  *B32B 9/04*    (2006.01)
  *A61F 13/15*   (2006.01)
  *B41J 2/16*    (2006.01)

(52) U.S. Cl. .......... 156/276; 156/60; 156/326; 156/327; 428/411.1

(58) Field of Classification Search .............. 156/60, 156/276, 326, 327; 428/411.1
See application file for complete search history.

(56) References Cited

U.S. PATENT DOCUMENTS

| 5,120,665 | A | * | 6/1992 | Tsukagoshi et al. ............ 156/64 |
| 5,162,087 | A | * | 11/1992 | Fukuzawa et al. ............ 252/500 |
| 6,426,566 | B1 | | 7/2002 | Sawamoto |
| 2006/0154070 | A1 | | 7/2006 | Wakiya |

FOREIGN PATENT DOCUMENTS

CN   1289453 A   3/2001
(Continued)

OTHER PUBLICATIONS

International Search Report for PCT/JP2008/059388 completed Jul. 14, 2008.

(Continued)

*Primary Examiner* — Michael Orlando
(74) *Attorney, Agent, or Firm* — Buchanan Ingersoll & Rooney PC

(57) ABSTRACT

A method for connecting an electronic part, which contains: mixing a dispersing solvent, an adhesive resin which is dissolved in the dispersing solvent, conductive particles, and insulating particles which have smaller particle diameters than those of the conductive particles so as to prepare an anisotropic conductive adhesive; placing a terminal of a substrate and a terminal of an electronic part so as to face each other via the anisotropic conductive adhesive, and applying heat and pressure to the substrate and the electronic part so as to sandwich the conductive particles between the terminal of the substrate and the terminal of the electronic part to thereby deform the conductive particles, in which the pressure is smaller than pressure at which the conductive particles are destroyed, and smaller than pressure at which the particle diameters of the conductive particles become equal to the particle diameters of the insulating particles.

6 Claims, 3 Drawing Sheets

FOREIGN PATENT DOCUMENTS

| | | |
|---|---|---|
| JP | 8-113654 A | 5/1996 |
| JP | 11-203938 A | 7/1999 |
| JP | 2001-85083 A | 3/2001 |
| JP | 2002-75488 A | 3/2002 |
| JP | 2002-217239 A | 8/2002 |
| JP | 2003-165825 A | 6/2003 |
| JP | 2005-347273 A | 12/2005 |
| JP | 2006-182903 A | 7/2006 |

OTHER PUBLICATIONS

Written Opinion for PCT/JP2008/059388 completed Jul. 14, 2008 and Response to Written Opinion.

Office Action from Chinese Patent Office issued in corresponding Chinese Patent Application No. 200880019022.5 dated Jun. 17, 2011.

Office Action issued in corresponding Taiwanese Patent Application dated Mar. 7, 2012 with English Translation.

* cited by examiner

METHOD FOR CONNECTING ELECTRONIC PART AND JOINED STRUCTURE

CROSS-REFERENCE TO RELATED APPLICATION

This is a continuation of Application No. PCT/JP2008/059388, filed on May 21, 2008.

BACKGROUND OF THE INVENTION

1. Field of the Invention

The present invention relates to a method for connecting an electronic part, especially to a method for connecting an electronic part using an anisotropic conductive adhesive, and to a joined structure.

2. Description of the Related Art

An anisotropic conductive adhesive, in which conductive particles are dispersed in an adhesive, has been conventionally used for a connection of an electronic part.

However, as pitches between terminals of an electronic part have been narrowed in recent years, there are cases where the conductive particles are aggregated between the terminals adjacent each other, causing a short circuit between the terminals.

Especially when a device in which a semiconductor chip is connected to a tape carrier (TAB: Tape Automated Bonding) or a device in which a semiconductor chip is connected to a film carrier (COF: Chip On Film) is connected to a terminal placed at an edge portion of a liquid crystal display panel (LCD panel), a pressure-bonding tool is displaced, and a corner portion (the edge portion) of the LCD panel is pressure-bonded, the conductive particles are accumulated by the edge portion to cause the particle aggregation, causing a short circuit between terminals adjacent each other.

As a technology to reduce occurrences of a short circuit resulted from the aggregation of these conductive particles, there has been proposed to use particles in which an insulating coating is applied to each surface of conductive particles, to reduce the particle diameter of the conductive particles, to reduce the density of the conductive particles, and the like.

The particles applied with the insulating coating have a problem such that a short circuit is caused with the external force enough to destroy the insulating coating at the time when the aggregation is caused.

Moreover, the occurrence of the short circuit due to the particle aggregation cannot completely prevented just by reducing the particle diameter of the conductive particles, and it is also not desirable as the properties (recovery ability and the like) of the conductive particles themselves are reduced.

Furthermore, the proposed method for reducing the particle density to thereby prevent the particle aggregation has a problem such that the capturing of particles between the terminals becomes insufficient, causing a conduction failure.

Moreover, it has been known in the art that an anisotropic conductive adhesive in which insulating particles are added together with the conductive particles is used to completely prevent occurrences of the short circuit due to the particle aggregation (see Japanese Patent Application Laid-Open (JP-A) Nos. 2001-85083, 2005-347273, 2002-75488, 2003-165825, and 08-113654).

However, if the particle diameters of the insulating particles are large, the insulating particles are sandwiched between the terminals of the electronic part before the conductive particles are sandwiched therebetween. If the insulating particles are sandwiched before the conductive particles, the conductive particles are not brought into contact with the terminals, or the pressure applied to the conductive particles are small even in contact with the terminals and the deformation amount thereof becomes small. Therefore, a conduction failure may be occurred between the terminals.

Moreover, after the connection of the electronic part, there may be a case where a number of the captured conductive particles are examined to confirm the connection reliability. When the conductive particles are sandwiched between the terminals, minute uplifts are formed on the back surface of the terminal with a reactive force of the deformation of the conductive particles. Therefore, the number of the conductive particles sandwiched between terminals are confirmed by observing a back surface of the terminal mounted on the surface of the glass substrate from the back surface of the glass substrate of the LCD panel under a differential interference microscope (a differential interferometer) and counting the minute uplifts.

However, if the insulating particles are sandwiched between the terminals, minute uplifts are formed in the same manner as the case where the conductive particles are sandwiched. Here, the minute uplifts formed by sandwiching the insulating particles between the terminal and the minute uplifts formed by sandwiching the conductive particles cannot be distinguished, and thus the number of the captured conductive particles cannot be measured accurately.

Moreover, in the case where the conductive particles are pressed so as to be deformed for the purpose of increasing the contact area between the conductive particles and the terminals, the change of the insulating particles to be sandwiched between the terminals becomes high. Therefore, this problem is especially serious.

Furthermore, the insulating particles are generally constituted of resin particles, and thus the insulating particles tend to absorb the solvent contained in the anisotropic conductive adhesive during or after the production of the anisotropic conductive adhesive. When the insulating particles absorb the solvent, they are swollen and enlarge their particle diameters. Therefore, the problems such as a conduction familiar between the terminals, and measurement of the capturing number become more serious.

In addition to this, if the insulating particles absorb the solvent, the solvent is released from the insulating particles at the time when the anisotropic conductive adhesive is heated, and the solvent is evaporated to thereby form air bubbles (voids) in the anisotropic conductive adhesive.

BRIEF SUMMARY OF THE INVENTION

The present invention aims at providing a method for connecting an electronic part which is capable of accurately measuring the number of captured conductive particles, and has high conduction reliability after the connection, and providing a joined structure.

<1> A method for connecting an electronic part, containing:

mixing a dispersing solvent, an adhesive resin which is dissolved in the dispersing solvent, conductive particles, and insulating particles which have smaller particle diameters than those of the conductive particles so as to prepare an anisotropic conductive adhesive;

placing a terminal of a substrate and a terminal of an electronic part so as to face each other via the anisotropic conductive adhesive, and applying heat and pressure to the substrate and the electronic part so as to sandwich the conductive particles between the terminal of the substrate and the terminal of the electronic part to thereby deform the conductive particles, wherein the pressure is smaller than pressure at which the conductive particles are destroyed, and smaller than pressure at which the particle diameters of the conductive particles become equal to the particle diameters of the insulating particles.

<2> The method according to <1>, wherein the insulating particles have a total volume which is 0.2 times to 2 times of a total volume of the conductive particles.

<3> The method according to any of <1> or <2>, wherein the insulating particles are not swollen by a contact with the dispersing solvent.

<4> The method according to any one of <1> to <3>, wherein the insulating particle is an organic-inorganic hybrid particle which is an inorganic particle whose surface has functional monomers bonded thereto, and the adhesive resin is a polymer resin which is polymerizable with the functional monomers of the organic-inorganic hybrid particle.

<5> The method according to any one of <1> to <3>, wherein the insulating particle is an organic-inorganic hybrid particle which is an organic particle whose surface has an inorganic material bonded thereto.

<6> The method according to any one of <1> to <3>, wherein the insulating particle is formed of resin having an organic polymer skeleton to which at least one inorganic material skeleton is chemically bonded.

<7> An anisotropic conductive joined structure using the method for connecting an electronic part as defined in any one of <1> to <6>.

According to the present invention, the conventional problems in the art can be solved, and the following objects can be achieved. Namely, the present invention can provide a method for connecting an electronic part which is capable of accurately measuring the number of captured conductive particles, and has high conduction reliability after the connection, and provide a joined structure.

The present invention is constructed as mentioned above, and the particle diameters of the destroyed conductive particles, and a relationship between the pressure required to deform and destroy the conductive particles, and the particle diameters of the conductive particles have been determined by a preliminary experiment in advance.

Note that, the condition where the conductive particles are destroyed means the condition where the particle diameters of the conductive particles do not go back to the original size even after pressure is taken off, and their recovery ability has been lost. For example, in the case where the conductive particles are metal coated resin particles in which a metal coating is formed on each surface of the resin particles, it means the condition where the resin particles themselves are destroyed.

The composition, formulation ratio, thickness, and area of planar shape of the anisotropic conductive adhesive used for connecting the substrate and the electronic part, and particle diameters (before deformation) of the conductive particles are known in advance.

In the preliminary experiment, a sample piece formed of the same anisotropic conductive adhesive, having the same thickness, and having the same area to that used for connecting the substrate and the electronic part is sandwiched between two flat test plates at first, and then the same temperature and the same pressure to those for connecting the substrate and the electronic part are applied. Based on the pressure and the distance between the sample plates, the relationship between the pressure and the particle diameters of the conductive particles are determined.

Moreover, the conductive particles to be added to the anisotropic conductive adhesive are pressed and deformed to thereby determine the particle diameters of the destroyed conductive particles.

Moreover, if the particle diameters of the insulating particles are obtained in advance, it becomes clear which particle diameters are larger between the insulating particles and the destroyed particles. Therefore, it becomes clear that which pressure can be set as an upper limit of the pressure between the destroying pressure at which the conductive particles are destroyed, or the deforming pressure mentioned later, so as to deform the conductive particles in the range to have larger particle diameters than those of the insulating particles without destroying the conductive particles and to accurately measure the number of the captured conductive particles, the destroying pressure at which the conductive particles are destroyed, or the deforming pressure mentioned later.

Note that, in the case where the insulating particles are swollen by the contact with the dispersing solvent during or after the production of the anisotropic conductive adhesive, particle diameters of the swollen insulating particles can be measured in advance, and the pressure at which the particle diameters of the conductive particles become equal to the particle diameters of the swollen insulating particles is determined as deforming pressure.

According to the present invention, the insulating particles are not swollen, and thus does not become larger than the conductive particles. Moreover, even when the conductive particles are pressed, the pressed conductive particles do not become smaller than the insulating particles. Therefore, the particle diameters of the conductive particles do not become smaller than those of the insulating particles, and the insulating particles do not disturb the connection of the conductive particles. As a result, the conductive resistance is low. Furthermore, as only the part of the terminal of the substrate where the conductive particles are sandwiched forms a minute uplift, the number of the captured conductive particles can be accurately counted. In addition, as the conductive particles are not destroyed, high conduction reliability is attained. As the insulating particles do not absorb the dispersing solvent, no void is formed when the anisotropic conductive adhesive is heated.

Figure 1:
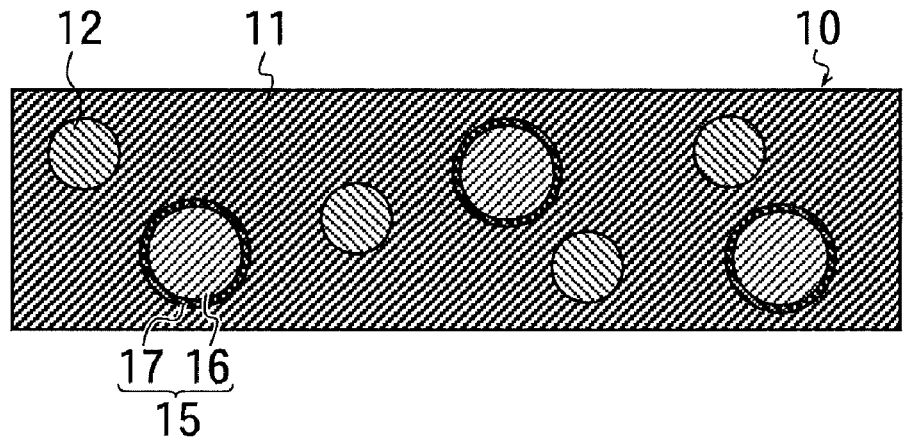
FIG. 1 is a cross-sectional view of an anisotropic conductive adhesive.

DETAILED DESCRIPTION OF THE INVENTION (Method for Connecting Electronic Part)

The method for connecting an electronic part of the present invention contains at least a mixing step and a heat-pressurizing step, and may further contain other steps as necessity.

<Mixing Step>

The mixing step is mixing a dispersing solvent, an adhesive resin which is dissolved in the dispersion solvent, conductive particles, insulating particles each of which has a smaller particle diameter than that of the conductive particles, and arbitrarily selected other components as necessity, so as to prepare an anisotropic conductive adhesive.

-Dispersing Solvent-

The dispersing solvent is suitably selected depending on the intended purpose without any restriction. The dispersing solvent is not limited to a mixed solvent of ethyl acetate and toluene, but organic solvents such as methylethylketone (MEK), toluene, propyleneglycol monomethylether acetate (PGMAC), and ethyl acetate may be used. These organic solvents do not dissolve the organic-inorganic hybrid particles and silicone resin particles, nor make them swollen.

-Adhesive Resin-

The adhesive resin is suitably selected depending on the intended purpose without any restriction, provided that it is dissolved in the aforementioned dispersing solvent. The adhesive resin contains at least one of or both of a thermosetting resin and a thermoplastic resin. The thermosetting resin is polymerized with heat to thereby cure the binder, and the thermoplastic resin exhibits adhesion with heat, and makes the binder solidified when being cooled after the heating.

-Thermosetting Resin-

The thermosetting resin is suitably selected depending on the intended purpose without any restriction, and it is possible to use, as the thermosetting resin, epoxy resin, anionic curing epoxy resin using a microcapsulated amine curing agent as a curing agent, cationic curing epoxy resin using an anium salt or sulfonium salt as a curing agent, radical curing resin using organic peroxide as a curing agent.

-Thermoplastic Resin-

The thermoplastic resin is suitably selected depending on the intended purpose without any restriction, and examples thereof include phenoxy resin, urethane resin, polyester resin, and the like.

-Conductive Particles-

The conductive particles are suitably selected depending on the intended purpose without any restriction. Examples thereof include organic resin spherical particles each surface of which is plated with nickel or gold, in which the organic resin spherical particles are each formed of monopolymer or copolymer of benzoguanamine, styrene, divinylbenzene, a acryl compound, or a methacryl compound, and inorganic particles, such as nickel fine particles, each surface of which is metal plated.

The deformed amount of the conductive particle is not restricted, but the deformed amount (the reduced amount of the particle diameter) of the conductive particle is preferably 20% or more in view of conduction reliability.

In the case where the conductive particles are metal coated resin particles, the conductive particles generally have the deformed amount of 60% when destroyed, and the particle diameters of the deformed particles are 0.4 times of the particle diameters of the conductive particles before destroyed.

It is desirable that the conductive particles have a particle size precision such as CV value of 20% or less, preferably 10% or less. The CV value is a value which is obtained by dividing the standard deviation with the particle diameter.

-Insulating Particles-

The insulating particles are suitably selected depending on the intended purpose without any restriction, provided that the insulating particles have smaller particle diameters than those of the conductive particles. Examples thereof include organic-inorganic hybrid particles such as silicone resin particles. The insulating particles are not dissolved in the dispersing solvent, and are not swollen by absorbing the dispersing solvent. Therefore, the insulating particles remain their particle diameters without changing, and the particle diameters thereof stays smaller than those of the conductive particles.

Since the insulating particles do not absorb the dispersing solvent, it does not cause the formation of voids in the binder at the time of the heating. The substrate and the electronic part are physically strongly connected to each other with the solidified binder.

The amount of the insulating particles is preferably more than 0.05 times but less than 2.5 times of the total volume of the conductive particles, more preferably 0.2 times to 2 times of the total volume of the conductive particles.

As the insulating particles, organic-inorganic hybrid particles, or other than resin particles, ceramic particles such as glass particles may be used. However, in the case where the conductive particles are metal coated resin particles, a difference between the specific gravity of the ceramic particles and that of the conductive particles is large, and thus there may be a problem related to the dispersibility in the anisotropic conductive adhesive.

It is desirable that the insulating particles have particle size precision such as CV value of 20% or less, preferably 10% or less. The CV value is a value which is obtained by dividing the standard deviation with the particle diameter.

-Organic-Inorganic Hybrid Particles-

The organic-inorganic hybrid particles are suitably selected depending on the intended purpose without any restriction. Examples thereof include following 1 to 3.

1. Inorganic particles in which the inorganic constituting material thereof is bonded to functional monomers at each surface of the particles
2. Organic particles in which the constituting material of the organic particles are bonded to an inorganic particles at each surface of the particles
3. Particles formed of an inorganic containing resin in which at least one inorganic material skeleton has previously been chemically bonded to the organic polymer skeleton The inorganic particles for use in the organic-inorganic hybrid particles are suitably selected depending on the intended purpose without any restriction. Examples thereof include silica particles, and calcium carbonate particles.

The functional monomers are suitably selected depending on the intended purpose without any restriction. Examples thereof include vinyl monomers, acryl monomers, methacryl monomers, epoxy monomers, oxetane monomers, and isocyanate monomers. One type of the functional monomers may be bonded to one inorganic particle, or two or more types of the functional monomers may be bonded to one inorganic particle.

In the case of the organic-inorganic hybrid particles having the organic compound exposing to each surfaces thereof, the organic compound may be swollen depending on the type of the mixed solvent for use. However, the organic compound is laminated on the surface of the organic-inorganic hybrid particle only for the degree of a few molecules, and the thickness of the organic compound is small enough to ignore compare to the particle diameter of the entire organic-inorganic hybrid particle (e.g., 2 μm to 4 μm). Accordingly, even if the organic compound is swollen with the mixed solution, the swelling ratio thereof does not exceed 30%.

In the case of the organic-inorganic hybrid particles having the functional monomers exposing to each surface thereof, such organic-inorganic hybrid particles has high compatibility to the adhesive resin compare to inorganic particles having only the organic material exposing to the surface thereof, and thus they have excellent dispersibility in the anisotropic conductive adhesive.

Moreover, when the resin which is polymerizable with the functional groups of the functional monomers is added to the adhesive resin, such resin is polymerized with the functional monomers at the time of the final pressure-bonding, and thus the physical strength of the anisotropic conductive adhesive is improved after curing.

Examples of the resin polymerizable with the acryl monomers and the methacryl monomers are acryl resin and the like, examples of the resin polymerizable with the vinyl monomer, the epoxy monomers, and the oxetane monomers are epoxy resin and the like, and examples of the resin polymerizable with the isocyanate monomers are urethane resin and the like.

Among the organic-inorganic hybrid particles, the aforementioned "organic particles in which the constituting material of the organic particles are bonded to an inorganic particles at each surface of the particles" are such that organic particles (resin particles) to each surface of which an inorganic compound such as polysiloxane is bonded, and examples thereof include SOLIOSTAR15. SOLIOSTAR15 is acryl resin particles to each surface of which an inorganic compound (silica) is bonded by polymerizing acryl polymer having a siloxane skeleton.

Moreover, among the organic-inorganic hybrid particles, the aforementioned "particles formed of an inorganic containing resin in which at least one inorganic material skeleton has previously been chemically bonded to the organic polymer skeleton" are those obtained by polymerizing a compound having at least one polysiloxane skeleton in an organic polymer skeleton, and examples thereof include silicone resin particles.

The polysiloxane skeleton of each silicone resin particle has the siloxane structure represented by the following chemical formula 1 as a repeating unit.

Chemical Formula 1

In the silicone resin, organic substituents, such as an alkyl group, and a phenyl group are bonded to at least part of, or all of the siloxane structures of the polysiloxane skeleton.

These organic-inorganic hybrid particles are not only having excellent chemical resistance, swelling resistance, and heat resistance, but also having low thermal expansion coefficient, and not making the particle diameters thereof larger than those of the conductive particles with heat. Especially, the silicone resin particles have advantages such that the use of the silicones resin particles as the insulating particles reduces the production cost, as the silicone resin particles are inexpensive compared to other organic-inorganic hybrid particles.

The insulating particle is not limited to the organic-inorganic hybrid particle, and a resin particle can be used as the insulating particle, provided that it is not swollen in the dispersing solvent contained in the anisotropic conductive adhesive.

The resin particle is suitably selected depending on the intended purpose without any restriction, provided that it is not dissolved and swollen in the dispersing solvent. The organic polymer skeleton of the resin particle is not restricted in terms of a molecular weight, a composition, a structure, presence of any functional groups, and the like, and examples thereof include polymers of acryl monomer, methacryl monomer, or acrylonitrile, and formaldehyde condensates of benzoguanamine or melamine.

-Other Components-

As solids of the anisotropic conductive adhesive, other than the thermosetting resin and the thermoplastic resin, various additives such as a curing agent, silane, fillers, and a colorant, can be added.

<Heating and Pressing Step>

The heating and pressing step is placing a terminal of a substrate at the side of the substrate and a terminal of an electronic part at the side of the electronic part so as to face each other via the anisotropic conductive adhesive, and applying heat and pressure to the substrate and the electronic part so as to sandwich the conductive particles between the terminal of the substrate and the terminal of the electronic part, to thereby deform the conductive particles.

-Substrate-

The substrate is suitably selected depending on the intended purpose without any restriction. Examples thereof include a transparent panel of a liquid crystal display (LCD).

-Electronic Part-

The electronic part is suitably selected depending on the intended purpose without any restriction. Examples thereof include a film device in which a semiconductor chip is mounted on a film substrate (e.g. a COG device, and a TAB device).

<Other Steps>

Other steps are suitably selected depending on the intended purpose without any restriction.

One example of a production process of the anisotropic conductive adhesive for use in the present invention will be explained with reference to the drawings hereinafter.

FIG. 1 is a cross-sectional view schematically showing an anisotropic conductive adhesive 10. The anisotropic conductive adhesive 10 contains a binder 11 in the form of a paste, in which an adhesive resin is dissolved in a dispersing solvent, conductive particles 15 and insulating particles 12 both of which are dispersed in the binder 11, and the entire anisotropic conductive adhesive 10 is in the form of a paste.

The anisotropic conductive adhesive 10 may be used as a paste, or may be formed into a film and used as a film.

One example of the formation of the film will be explained as follow. The paste-form anisotropic conductive adhesive 10 containing the mixed solvent (dispersing solvent) is applied onto a surface of a release film by means of an applicator, such as a bar coater, and a coated layer having a predetermined thickness is formed. Thereafter, the coated layer is heated so as to remove the excessive solvent therefrom, to thereby obtain an anisotropic conductive adhesive in the form of a film (an adhesive film).

If the insulating particles 12 are swollen by absorbing the mixed solvent, the particle diameter of each of the insulating particles is enlarged. If the particle diameters of the insulating particles 12 are enlarged, there are problems such that lines are formed at the time of the coating, and an adhesive film having a even film thickness cannot be obtained in the case where the diameters of the insulating particles 12 exceed the film thickness of the coated layer to be formed.

As the insulating particles 12 are not swollen with the dispersing solvent, no line is formed at the time of the coating, and an adhesive film having an even film thickness can be obtained.

A method for using the anisotropic conductive adhesive 10 will be explained hereinafter.

The conductive particles 15 contained in the anisotropic conductive adhesive 10 are particles to each surface of which the conductive material is exposed, and which are deformable with pressure.

For example, the conductive particles 15 are metal coated resin particles in which a metal coating 17 is formed each surface of the resin particles 16, or metal particles, and the metal coated particles are elastic deformed with pressure and the metal particles are plastic deformed with pressure.

The particle diameters of the destroyed conductive particles 15, and a relationship between the pressure required to deform and destroy the conductive particles 15, and the particle diameters of the conductive particles 15 have been determined by a preliminary experiment in advance.

The particle diameters of the insulating particles 12 have been known beforehand, and the particle diameters of the insulating particles 12 and the particle diameters of the destroyed conductive particles 15 are compared. In the case where the particle diameters of the insulating particles 12 are smaller than the particle diameters of the destroyed conductive particles 15, the pressure required for the particle diameters of the conductive particles 15 to reach the particle diameters of the destroyed conductive particles 15 (destroying pressure) is obtained from the relationship between the pressure and the particle diameters of the conductive particles 15, and the destroying pressure is set as an upper limit of the pressure applied in the heating and pressing unit.

In the case where the particle diameters of the insulating particles 12 are equal to or larger than the particle diameters of the destroyed conductive particles 15, the pressure required for the particle diameters of the conductive particles 15 to be same as the particle diameters of the insulating particles 12 (deforming pressure) is obtained from the relationship between the pressure and the particle diameters of the conductive particles 15, and the deforming pressure is set as an upper limit of the pressure applied in the heating and pressing unit.

The pressure is set enough to deform the conductive particles 15 within the range less than the set upper limit.

One example of the step for connecting the substrate and the electronic part will be explained based on the set pressure.

Figure 2A:
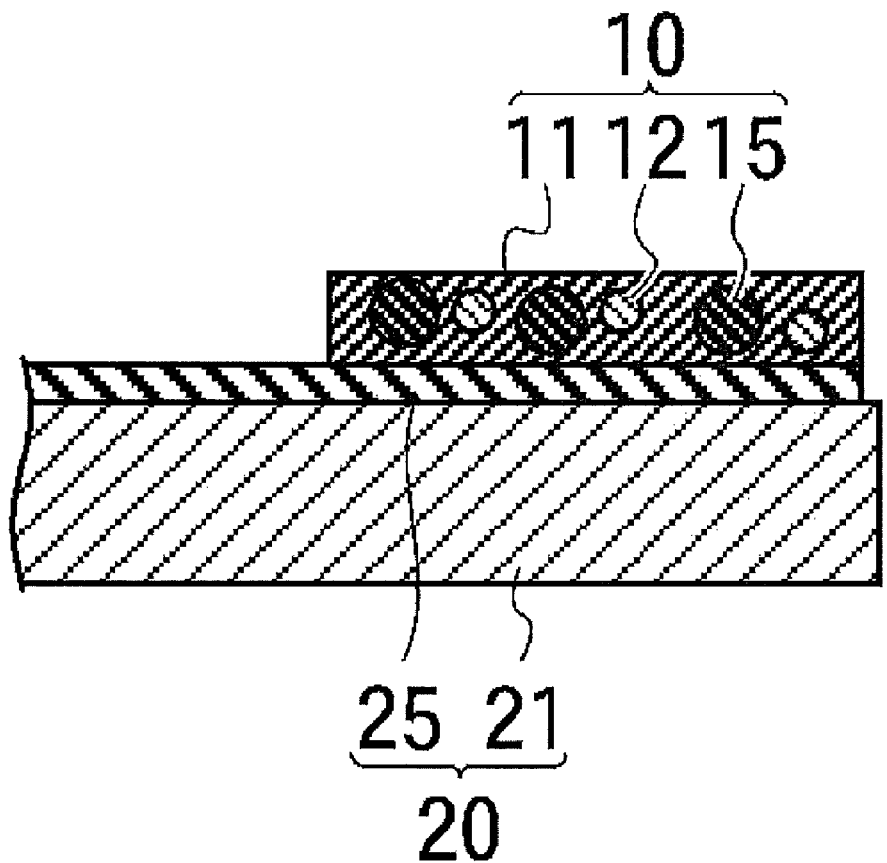
FIG. 2A is a cross-sectional view illustrating a process for connecting a first electronic part.

FIG. 2A illustrates the substrate 20. The substrate 20 has a substrate body 21 in the shape of a plate, and a substrate terminal 25 which is disposed on a surface of the substrate body 21. The substrate terminal 25 is exposed to the surface edge portion of the substrate body 21, the exposed portion of the substrate terminal 25 is covered with an anisotropic conductive adhesive 10 (temporal bonding) by applying the paste-form anisotropic conductive adhesive 10, or bonding the film-form anisotropic conductive adhesive 10 to the surface edge portion.

Figure 2B:
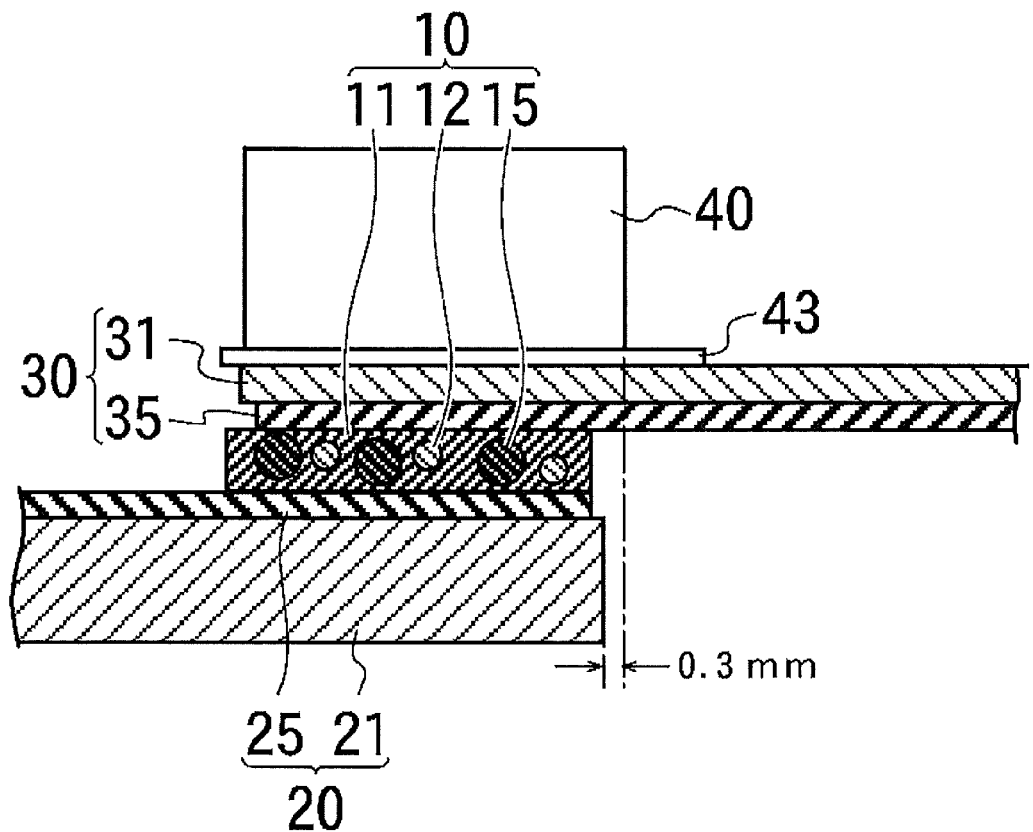
FIG. 2B is a cross-sectional view illustrating a process for connecting a second electronic part.

FIG. 2B illustrates an electronic part 30 such as a COF device or TAB device. The electronic part 30 has a long and narrow part body 31, and a part terminal 35 disposed on a surface of the part body 31, and the part terminal 35 is exposed to the surface edge of the part body 31.

After placing the substrate 20 and the electronic part 30 so that the substrate terminal 25 and the part terminal 35 are face to each other sandwiching the anisotropic conductive adhesive 10 therebetween (temporal fixing), a pressure-bonding unit 40 is placed to and pressed against at least one of, or both of the substrate 20 and the electronic part 30 directly or via a buffer material 43.

Here, the pressure-bonding unit 40 is equipped with a heating means that is not shown in the figure, and the pressure-bonding unit 40 applies the pressure to the electronic part 30 while heating. Once the predetermined pressure is applied to the electronic part 30 and the substrate 20, the binder 11 softened with the heat is pushed out from the space between the substrate terminal 25 and the part terminal 35, the conductive particles 15 are sandwiched between the substrate terminal 25 and the part terminal 35, and pressed to be deformed, so that the substrate terminal 25 and the part terminal 35 are electrically connected via the conductive particles 15.

Figure 4:
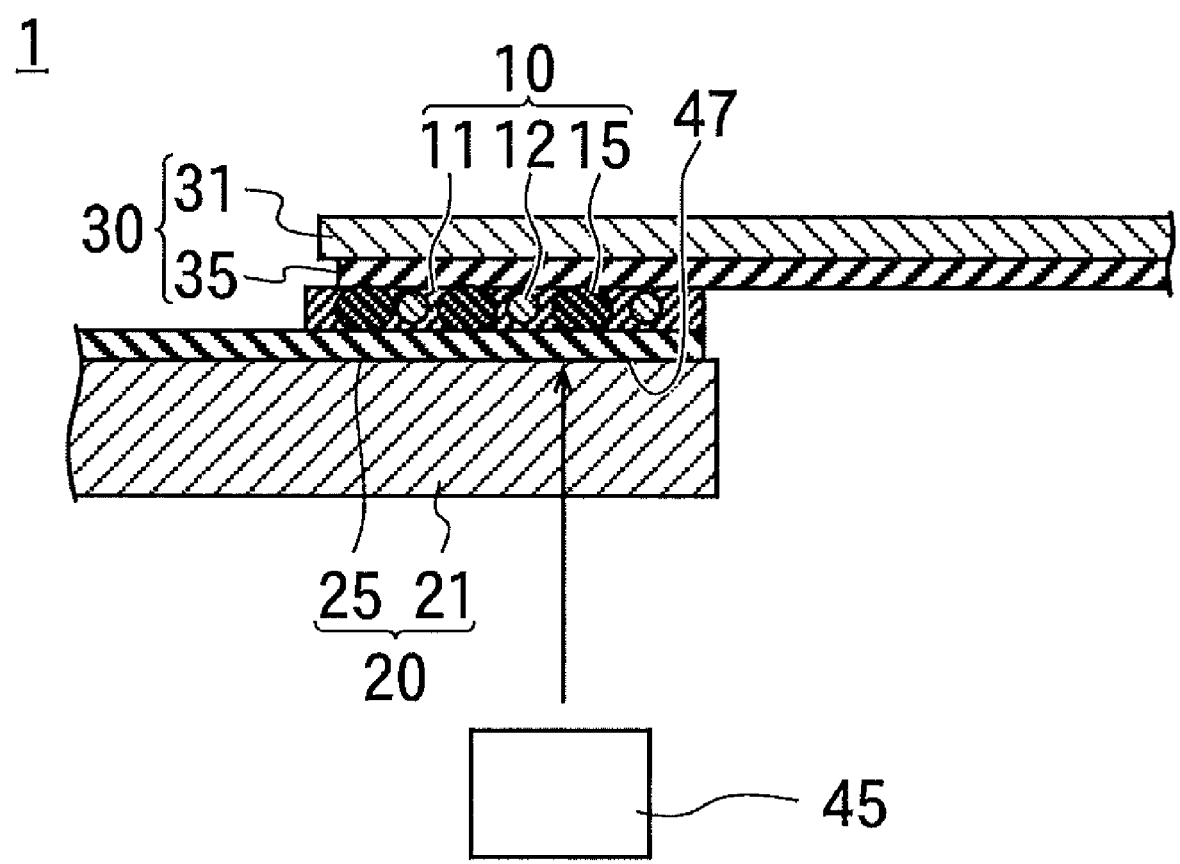
FIG. 4 is a cross-sectional view illustrating an inspection process after the connection.

FIG. 4 illustrates a joined structure 1 in which the substrate 20 and the electronic part 30 are electrically and physically connected, and the number of the captured conductive particles 15 is examined with this joined structure 1.

The substrate body 21 is constituted of a transparent substrate such as a glass substrate or a plastic substrate.

FIG. 4 illustrates an examination unit 45 having a microscope (e.g. a differential interference microscope, or a phase contrast microscope). The back surface 47 of the substrate terminal 25 is observed from the surface of the substrate body 21 opposite to the surface thereof where the substrate terminal 25 is disposed by means of the examination unit 45, and the number of the minute uplifts formed on the back surface 47 is counted.

As mentioned earlier, the pressure does not exceed the destroying pressure and deforming pressure of the conductive particles 15, and thus the conductive particles 15 are not destroyed, and moreover the particle diameters of the conductive particles 15 do not become smaller than those of the insulating particles 12. Therefore, the distance between the substrate terminal 25 and the part terminal 35 does not become smaller than the particle diameters of the insulating particles 12.

The insulating particles 12 are not pressed between the substrate terminal 25 and the part terminal 35, and only the conductive particles 15 are pressed and then deformed to form minute uplifts. Therefore, the number of the minute uplifts is matched to the number of the conductive particles 15 pressed between the substrate terminal 25 and the part terminal 35. Accordingly, the number of the captured conductive particles 15 can be accurately determined.

Hereinafter, examples and comparative examples of the present invention will be specifically explained, but these examples and comparative examples shall not be construed as limiting the scope of the present invention.

<Production Step of Adhesive Film>

Phenoxy resin, which was a thermoplastic resin, was dissolved in a dispersing solvent in which toluene and ethyl acetate are mixed in the mass ratio of 1/1, to thereby obtain 30% by mass phenoxy resin solution.

Thereafter, a curing agent, epoxy resin, which was a thermoplastic resin, a coupling agent, insulating particles and conductive particles were added to the solution so that the formulated amounts thereof were to be those shown in Table 1 based on the phenoxy resin, and the solution was adjusted so that the solid content thereof (the total amount of the phenoxy resin, the curing agent, the epoxy resin, the coupling agent, the insulating particles, and the conductive particles) was to be 40% by mass with toluene, to thereby obtain 6 different solutions of a connecting material.

The solution of the connecting material was applied to a surface of a release film having a thickness of 50 μm, and left in an oven at the temperature of 90° C. for 3 minutes so as to evaporate the solvent, to thereby obtain an adhesive films (film-form anisotropic conductive adhesives) of Examples 1 to 4, and Comparative Examples 1 and 2, each having a thickness of 18 μm.

TABLE 1

Composition of solids content of the anisotropic conductive adhesive (part(s) by mass)

| | Product Name | Comp. Ex. 1 | Ex. 1 | Ex. 2 | Ex. 3 | Comp. Ex. 2 | Ex. 4 |
|---|---|---|---|---|---|---|---|
| Curing agent | HX3941 | 50 parts | 50 parts | 50 parts | 50 parts | 50 parts | 50 parts |
| Epoxy resin | EP828 | 14 parts | 14 parts | 14 parts | 14 parts | 14 parts | 14 parts |
| Phenoxy resin | YP50 | 35 parts | 35 parts | 35 parts | 35 parts | 35 parts | 35 parts |
| Coupling agent | KBE403 | 1 part | 1 part | 1 part | 1 part | 1 part | 1 part |
| Insulating particles | TOSPEARL107 | — | 0.5% | 10% | 25% | — | — |
| | TOSPEAEL140 | — | — | — | — | 10% | — |
| | SOLIOSTAR15 | — | — | — | — | — | 10% |
| Conductive particles | AUL704 | 10% | 10% | 10% | 10% | 10% | 10% |

(The insulating particles and the conductive particles are each expressed with a volume ratio.)

Note that, the formulated amounts of the curing agent, the epoxy resin, the phenoxy resin, and the coupling agent are respectively expressed with a mass ratio, the formulated amounts of the insulating particles and the conductive particles are respectively expressed with a percentage in the adhesive excluding the mixed solvent (the solid content).

In Table 1, the product name "HX3941" is a microcapsule amine-based epoxy curing agent manufactured by ASAHI KASEI CHEMICALS CORPORATION, the product name "EP828" is bisphenol A-based liquid epoxy resin manufactured by Japan Epoxy Resins Co., Ltd., the product name "YP50" is bisphenol A-based phenoxy resin manufactured by Tohto Kasei Co., Ltd., and the product name "KBE403" is a epoxy silane coupling agent manufactured by Shin-Etsu Chemical Co., Ltd.

The conductive particles 15 are the product name "AUL704" manufactured by SEKISUI CHEMICAL CO., LTD., and are metal coated resin particles (average particle diameter of 4 µm) in which a Ni/Au plating film is formed on each surface of acryl resin particles.

Among the insulating particles 12, the product name "TOSPEARL107" and the product name "TOSPEARL140" are respectively silicone resin particles manufactured by Momentive Performance Materials Japan Inc., and the particle diameters (an average particle diameter) of "TOSPEARL107" are (is) 0.7 µm, the particle diameters (an average particle diameter) of "TOSPEARL140" are (is) 4.0 µm. Moreover, the product name "SOLIOSTAR15" is organic-inorganic hybrid particles (silica-acryl composite compound) manufactured by NIPPON SHOKUBAI CO., LTD., and the particle diameters (an average particle diameter) thereof are (is) 1.5 µm. All of these three different insulating particles 12 are not swollen with or dissolved in the dispersing solvent.

<Mounting Step>

An aluminum patterned glass (surface resistance of 10Ω/sq., glass thickness of 0.7 mm) in which aluminum terminals had been formed on a surface of the glass substrate was used as a substrate 20 for an evaluation test, and a COF device in which Sn-plated copper terminals had been formed on a surface of a base film having a thickness of 38 µm was used as an electronic device.

Note that, each of the aluminum patterned glass and the COF device had a terminal pitch of 38 µm, and L(a terminal width)/S(a distance between the terminals) of 23 µm/15 µm, and the terminals of the COF device had a top width of 15 µm.

Each of the adhesive films of Examples 1 to 4 and Comparative Examples 1 and 2 were cut into a width of 1.5 mm and pressed by a pressure-bonding unit having a tool width of 2.0 mm at 80° C. and 1 MPa for 2 seconds via a buffer material formed of a Teflon (registered trade mark) film having a thickness of 70 µm so as to temporarily bond to the aluminum patterned glass.

Subsequentially, the COF device was temporarily fixed using the same pressure-bonding unit used for the temporal bonding at 80° C. and 0.5 MPa for 0.5 seconds.

Finally, heat and pressure were applied at 190° C. and 3 MPa for 10 seconds using a pressure-bonding unit 40 having a tool width of 1.5 mm and a buffer material 43 formed of silicone rubber having a thickness of 200 µm so as to perform a final pressure-bonding, to thereby obtain connected bodies of Examples 1 to 4, and Comparative Examples 1 and 2. Note that, as shown in FIG. 2B, the final pressure-bonding was performed under the condition such that the pressure-bonding unit 40 was bulge out from the edge of the aluminum patterned glass (the substrate 20) by 0.3 mm so that the conductive particles 15 were intentionally made aggregated.

<Short Circuit Occurring Rate, Conductive Resistance>

Figure 3:
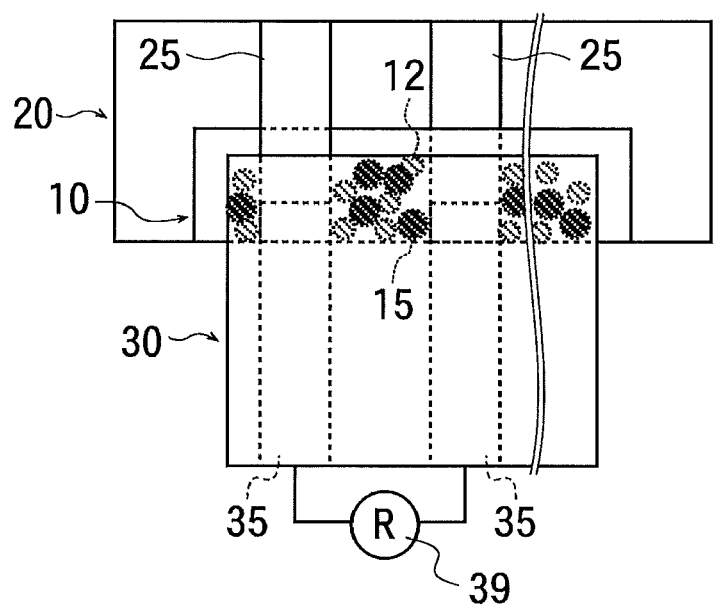
FIG. 3 is a schematic plain view of a joined structure.

FIG. 3 illustrates a schematic plane view of the joined structure. As shown in FIG. 3, a voltage of 30 V was applied between the terminals of the COF device (part terminals 35), and insulation resistance was measured. The insulation resistance of $1.0 \times 10^{-6} \Omega$ or less was regarded was an occurrence of a short circuit, and a "short circuit occurring ratio" was obtained (initial). In FIG. 3, the insulation resistance is measured by the insulation resistance measuring instrument 39.

Each of the joined structure was left in the high temperature and high humidity condition of 85° C. and 85% for 500 hours while an electric current was applied between the part terminals 35, and then the "short circuit occurring ratio" was measured again. In addition, the "conductive resistance" between the terminal of the aluminum patterned glass and the terminal of the COF device was measured on the joined structure left in the high temperature and high humidity condition.

<Evaluation for Capturing>

For each of the connected bodies of Examples 1 to 4, and Comparative Examples 1 and 2, a back surface of the aluminum terminal was observed under a differential interferometer (a differential interference microscope), and a number of minute uplifts (indentations) was counted.

Thereafter, the COF device was peeled off from the aluminum patterned glass, and a number of the conductive particles actually remained on the surface of the aluminum terminal was counted. The case where the number of the indentations and the number of the remained conductive particles are matched was judged as A, and the case where the number of the remained conductive particles was smaller than the number of the indentations was judged as B.

The results of the "short circuit occurring ratio," "conductive resistance," and "evaluation for capturing" are shown in Table 2.

TABLE 2

| | | Mesurment results | | | | | |
|---|---|---|---|---|---|---|---|
| | | Comp. Ex. 1 | Ex. 1 | Ex. 2 | Ex. 3 | Comp. Ex. 2 | Ex. 4 |
| Conductive resistance (85° C./85%/500 h) | Max. | 0.88 Ω | 0.88 Ω | 0.88 Ω | 1.18 Ω | 8.97 Ω | 0.88 Ω |
| | Min. | 0.68 Ω | 0.68 Ω | 0.68 Ω | 0.68 Ω | 1.81 Ω | 0.68 Ω |
| | Ave. | 0.79 Ω | 0.79 Ω | 0.79 Ω | 1.39 Ω | 3.34 Ω | 0.79 Ω |
| Short circuit occurring ratio | Initial | 0.9% | 0.2% | 0% | 0% | 0% | 0% |
| | 85° C./85%/500 h | 1.5% | 1.0% | 0% | 0% | 0% | 0% |
| Evaluation for capturing | | A | A | A | A | B | A |

(measurement number N = 200)

As was clear from Table 2, Comparative Example 1 in which the insulating particles were not added to the adhesive film caused blockages at the edge portion of the aluminum patterned glass, causing a short circuit between the terminals adjacent to each other.

With the aforementioned conditions for the final pressure-bonding, the conductive particles were not destroyed and deformed by 10% to 60% in the connected bodies of Comparative Examples 1 and 2 and Examples 1 to 4, and the particle diameters of the conductive particles did not become smaller than those of the insulating particles in Examples 1 to 4.

In contrast, the particle diameters of the conductive particles became smaller than those of the insulating particles in Comparative Example 2, and errors were caused in the evaluation for capturing because the insulating particles are deformed by being pressed together with the conductive particles. In addition, as the pressure was also applied to the insulating particles, the deformed amount of the conductive particles became small, leading to high conductive resistance.

Compared to Comparative Example 2, Examples 1 to 4 had low conductive resistance and accurate results of the evaluation for capturing.

Although the different types of the insulating particles were used in Examples 2 and 4, the results for the "conductive resistance," "short circuit occurring ratio," and "evaluation for capturing" were the same in the both examples. Therefore, it was found that a joined structure of high conduction reliability could be obtained regardless of the type of the insulating particles for use, provided that the particle diameters of the conductive particles after the deformation were equal to or larger than those of the insulating particles.

Example 1 had the low short circuit occurring ratio compared to Comparative Example 1, but had the high short circuit occurring ratio compared to other examples. In Example 1, the amount (the total volume) of the insulating particle was small such as 0.05 times of the amount (the total volume) of the conductive particles. In order to prevent the occurrences of the short circuit unfailingly, it is necessary to contain the insulating particle at an amount more than 0.05 times (volume ratio) of the conductive particles.

Moreover, Example 3 had excellent results in the short circuit occurring ratio and the evaluation for capturing, but had high conductive resistance compared to other examples. In Example 3, the amount (the total volume) of the insulating particles was large such as 2.5 times of the amount (the total volume) of the conductive particles. Therefore, it was suspected that the removability of the binder 11 from the space between the aluminum terminal and the copper terminal was suppressed, and thus the conductive resistance was increased, causing the conduction failure. Accordingly, to prevent the conduction failure, it is necessary to contain the insulating particles at an amount of less than 2.5 times (volume ratio) of the conductive particles.

The embodiment in which the anisotropic conductive adhesive 10 is temporarily bonded to the substrate 20, and then temporarily fixed to the electronic part 30 has been explained above, but the present invention is not limited to this embodiment. The anisotropic conductive adhesive 10 can be temporarily bonded to the electronic part 30, or can be temporarily bonded to both the electronic part 30 and the substrate 20. Moreover, the final pressure-bonding can be performed using the same pressure-bonding unit used for the temporal fixing to the electronic part 30.

The method for connecting of the present invention is not limited to the connection between the substrate and the electronic part, but also used for the connection between various electronic parts, such as a semiconductor chip, a resistance element, a flexible wiring board, and a rigid wiring board.

Accordingly, as long as the particle diameters of the insulating particles 12 are less than 0.4 times of the particle diameters of the conductive particles 15 before the deformation, the particle diameters of the insulating particles 12 become smaller than the particle diameters of the deformed conductive particles. Therefore, the destroying pressure can be set as an upper limit of the pressure in the heating and pressing step.

The particle diameters of the insulating particles 12 are preferably 10% or more of the particle diameters of the conductive particles 15 before the deformation. When the particle diameters of the insulating particles 12 are less than 10%, the effect in preventing a short circuit becomes poor when the conductive particles 15 are aggregated.

By using the particles which are not dissolved in or swollen with the dispersing solvent as the insulating particles 12, the particle diameters of the insulating particles 12 do not become large, and in the case where the pressure close to the deforming pressure is applied, the particle diameters of the conductive particles 15 do not become smaller than the particle diameters of the insulating particles 12 even when the conditions such as the formulated amount of the anisotropic conductive adhesive 10, or heating temperature are different from those of the preliminary experiment to some extent.

Note that, in the present invention, the "insulating particles which are not swollen with the dispersing solvent" means insulating particles have the particle diameters da that is 1.3 times or less (swelling ratio of 30% or less) of the particle diameters db, where da denotes the particle diameter after immersed in the same dispersing solvent to the one used in the anisotropic conductive adhesive for 30 minutes, and db denotes the particle diameters before immersed in the dispersing solvent.

What is claimed is:

1. A method for connecting an electronic part, comprising:

mixing a dispersing solvent, an adhesive resin which is dissolved in the dispersing solvent, conductive particles, and insulating particles which have smaller particle diameters than those of the conductive particles so as to prepare an anisotropic conductive adhesive;

placing a terminal of a substrate and a terminal of an electronic part so as to face each other via the anisotropic conductive adhesive, and applying heat and pressure to the substrate and the electronic part so as to sandwich the conductive particles between the terminal of the substrate and the terminal of the electronic part to thereby deform the conductive particles, wherein the pressure is smaller than pressure at which the conductive particles are destroyed, and smaller than pressure at which the particle diameters of the conductive particles become equal to the particle diameters of the insulating particles and, wherein the insulating particle is an organic-inorganic hybrid particle which is an inorganic particle whose surface has functional monomers bonded thereto, and the adhesive resin is a polymer resin which is polymerizable with the functional monomers of the organic-inorganic hybrid particle.

2. A method for connecting an electronic part, comprising:

mixing a dispersing solvent, an adhesive resin which is dissolved in the dispersing solvent, conductive particles, and insulating particles which have smaller particle diameters than those of the conductive particles so as to prepare an anisotropic conductive adhesive;

placing a terminal of a substrate and a terminal of an electronic part so as to face each other via the anisotropic conductive adhesive, and applying heat and pressure to the substrate and the electronic part so as to sandwich the conductive particles between the terminal of the substrate and the terminal of the electronic part to thereby deform the conductive particles, wherein the pressure is smaller than pressure at which the conductive particles are destroyed, and smaller than pressure at which the particle diameters of the conductive particles become equal to the particle diameters of the insulating particles and, wherein the insulating particle is an organic-inorganic hybrid particle which is an organic particle whose surface has an inorganic material bonded thereto.

3. A method for connecting an electronic part, comprising:

mixing a dispersing solvent, an adhesive resin which is dissolved in the dispersing solvent, conductive particles, and insulating particles which have smaller particle diameters than those of the conductive particles so as to prepare an anisotropic conductive adhesive;

placing a terminal of a substrate and a terminal of an electronic part so as to face each other via the anisotropic conductive adhesive, and applying heat and pressure to the substrate and the electronic part so as to sandwich the conductive particles between the terminal of the substrate and the terminal of the electronic part to thereby deform the conductive particles, wherein the pressure is smaller than pressure at which the conductive particles are destroyed, and smaller than pressure at which the particle diameters of the conductive particles become equal to the particle diameters of the insulating particles and, wherein the insulating particle is formed of resin having an organic polymer skeleton to which at least one inorganic material skeleton is chemically bonded.

4. An anisotropic conductive joined structure prepared by the method of claim 1.

5. An anisotropic conductive joined structure prepared by the method of claim 2.

6. An anisotropic conductive joined structure prepared by the method of claim 3.

* * * * *